United States Patent
Ryu et al.

(10) Patent No.: US 9,045,827 B2
(45) Date of Patent: Jun. 2, 2015

(54) APPARATUS AND METHOD FOR SUPPLYING LIGHT-EMITTING DIODE (LED) WAFER

(75) Inventors: in hwan Ryu, Ansan-si (KR); hak pyo Lee, Ansan-si (KR); il Chan Yang, Ansan-si (KR); Sung Kyu Choi, Anyang-si (KR); Byeong Seung Lee, Paju-si (KR)

(73) Assignees: LG CNS CO., LTD., Seoul (KR); Robostar Co., Ltd., Ansan-si (KR)

( * ) Notice: Subject to any disclaimer, the term of this patent is extended or adjusted under 35 U.S.C. 154(b) by 352 days.

(21) Appl. No.: 13/415,978

(22) Filed: Mar. 9, 2012

(65) Prior Publication Data
US 2013/0236275 A1 Sep. 12, 2013

(51) Int. Cl.
*H01L 21/68* (2006.01)
*C23C 16/458* (2006.01)
*H01L 21/677* (2006.01)
*H01L 21/687* (2006.01)

(52) U.S. Cl.
CPC ........ *C23C 16/458* (2013.01); *H01L 21/67742* (2013.01); *H01L 21/67766* (2013.01); *H01L 21/681* (2013.01); *H01L 21/68771* (2013.01)

(58) Field of Classification Search
CPC .................. H01L 21/67742; H01L 21/67745; H01L 21/67748; H01L 21/6838; H01L 21/681; H01L 21/682; H01L 21/683; H01L 21/68; H01L 21/677; H01L 21/67259; H01L 21/67265; H01L 21/67778; H01L 21/67781; H01L 21/6779; H01L 21/6773; B65G 49/07; G02F 1/01; G01N 21/9503
USPC ...................... 414/217, 744.8, 935, 936, 937, 414/939–941; 901/40
See application file for complete search history.

(56) References Cited

U.S. PATENT DOCUMENTS 4,720,635 A * 1/1988 Uga ............................. 250/548
4,845,373 A * 7/1989 Jamieson et al. ............. 250/548
(Continued)

FOREIGN PATENT DOCUMENTS

CN  201454870 U  5/2010
JP  63144956  6/1988
(Continued)

*Primary Examiner* — Saul Rodriguez
*Assistant Examiner* — Ronald Jarrett
(74) *Attorney, Agent, or Firm* — Hunter E. Webb; Keohane & D'Alessandro, PLLC

(57) ABSTRACT

Provided are an apparatus and method for supplying a light-emitting diode (LED) wafer that may quickly and accurately transfer LED wafers by acquiring position information of pockets in a carrier in which the LED wafers are to be seated. The apparatus may include a cassette in which a plurality of LED wafers are loaded, a carrier including a plurality of pockets in which the LED wafers are seated, an aligning unit to align the LED wafers that are to be seated in the carrier, a transfer robot to transfer the LED wafers from the cassette to the aligning unit, a picker to hold, in an adsorbed state, the LED wafers transferred to the aligning unit, or to release the adsorbed state, a capturing unit to fix the picker, and to acquire position information of the pockets, and an LED wafer loading robot to transfer the picker and the capturing unit from the aligning unit to the carrier. Accordingly, the LED wafers may be quickly and accurately loaded in the carrier and thus, it is possible to reduce a total process time and to significantly lower a defect rate.

6 Claims, 12 Drawing Sheets

(56) References Cited

U.S. PATENT DOCUMENTS

| | | |
|---|---|---|
| 6,135,854 A | 10/2000 | Masumura et al. |
| 2002/0153477 A1* | 10/2002 | Hasegawa et al. ............ 250/225 |
| 2005/0063799 A1* | 3/2005 | Larson et al. ................. 414/217 |
| 2009/0087932 A1* | 4/2009 | Kondoh .......................... 438/30 |

FOREIGN PATENT DOCUMENTS

| | | |
|---|---|---|
| JP | 02260010 | 10/1990 |
| JP | 05318310 | 12/1993 |
| JP | 11-207611 | 8/1999 |
| JP | 2004090154 | 3/2004 |

* cited by examiner

APPARATUS AND METHOD FOR SUPPLYING LIGHT-EMITTING DIODE (LED) WAFER

TECHNICAL FIELD

The present invention relates to an apparatus and method for supplying a light-emitting diode (LED) wafer, and more particularly, to an apparatus and method for supplying an LED wafer for use in metal-organic chemical vapor deposition (MOCVD) equipment.

BACKGROUND

In general, sapphire wafers are used to manufacture light-emitting diodes (LEDs) and the like. Such a plurality of LED wafers may be loaded in a carrier, and may be supplied to a chamber for a next process, for example, a deposition, and the like.

Conventionally, to transfer LED wafers from a cassette to a carrier, a worker performs operations of supplying the carrier, seating the LED wafers in the carrier, aligning the LED wafers, and recovering the carrier in which the LED wafers are seated.

However, when the worker manually performs the operations as described above, a working time may be delayed, which may cause problems, for example, a great reduction in productivity, a great consumption of the workforce, and a reduction in accuracy.

To solve the problems, conventionally, an automated apparatus for supplying LED wafers has been used, but workability is poor. Accordingly, there is a desire to develop an apparatus for supplying an LED wafer with a more efficient operating mechanism.

SUMMARY

An aspect of the present invention provides an apparatus and method for supplying a light-emitting diode (LED) wafer that may enable a series of processes from supplying of a carrier, in which LED wafers are to be seated, to recovering of a carrier, in which the LED wafers are seated, to be implemented by an efficient operating mechanism.

Another aspect of the present invention provides an apparatus and method for supplying an LED wafer that may quickly and accurately transfer LED wafers by acquiring position information of pockets in a carrier in which the LED wafers are to be seated.

According to an aspect of the present invention, there is provided an apparatus for supplying an LED wafer including: a supplying unit to supply a carrier; a seating unit to seat a plurality of LED wafers in the carrier; a recovering unit to recover the carrier; a Y-axis carrier transfer robot to repetitively move in a Y-axis direction so that the carrier is transferred from the supplying unit to the seating unit and the recovering unit; an aligning unit to align the LED wafers; a transfer robot to transfer the LED wafers loaded in a cassette to the aligning unit; and an LED wafer loading robot to repetitively move in an X-axis direction so that the LED wafers transferred to the aligning unit are picked up (i.e., lifted and transferred to the carrier, the LED wafer loading robot being disposed orthogonally to the Y-axis carrier transfer robot within the seating unit.

The apparatus may further include a carrier aligning unit to lift the carrier using vacuum and to enable the carrier to rotate 360°, so that the LED wafers are seated in the carrier.

According to another aspect of the present invention, there is provided a method of supplying an LED wafer including: supplying a carrier to a supplying unit; transferring the carrier to a seating unit; transferring, by a transfer robot, LED wafers loaded in a cassette to an aligning unit; seating, in the carrier, the LED wafers transferred to the aligning unit; rotating the carrier; transferring the carrier to a recovering unit when all of the LED wafers are seated in the carrier; and recovering the carrier in which the LED wafers are seated.

According to still another aspect of the present invention, there is provided an apparatus for supplying an LED wafer including: a cassette in which a plurality of LED wafers are loaded; a carrier including a plurality of pockets in which the LED wafers are seated; an aligning unit to align the LED wafers that are to be seated in the carrier; a transfer robot to transfer the LED wafers from the cassette to the aligning unit; a picker to hold, in an adsorbed state, the LED wafers transferred to the aligning unit, or to release the adsorbed state; a capturing unit to fix the picker, and to acquire position information of the pockets; and an LED wafer loading robot to transfer the picker and the capturing unit from the aligning unit to the carrier.

The capturing unit may include a low magnification camera to capture positions of the pockets at a low magnification, and a high magnification camera to capture the positions of the pockets at a high magnification.

According to yet another aspect of the present invention, there is provided a method of supplying an LED wafer including: rotating a plurality of LED wafers so that flat surfaces of the LED wafers face a single direction; holding, by a picker, the LED wafers in an adsorbed state; transferring the LED wafers to a carrier using an LED wafer loading robot; capturing a position of each of a plurality of pockets using a low magnification camera, the pockets being formed in the carrier; capturing the position of each of the pockets using a high magnification camera; and seating the LED wafers in the pockets.

The low magnification camera may capture an entire pocket at a single spot, and the high magnification camera may capture edges of the pocket at a plurality of spots.

According to embodiments of the present invention, an apparatus and method for supplying a light-emitting diode (LED) wafer may automatically perform a series of processes from supplying of LED wafers to loading of the LED wafers in a carrier, and a series of processes that are associated with supplying and recovering of a carrier.

Additionally, according to embodiments of the present invention, an apparatus and method for supplying an LED wafer may be less restricted in use of space, and a reduction in manufacturing costs may be expected due to a compact installation structure within a single frame.

Furthermore, according to embodiments of the present invention, an apparatus and method for supplying an LED wafer may quickly and accurately load LED wafers in a carrier and thus, it is possible to reduce a total process time and to significantly lower a defect rate.

BRIEF DESCRIPTION OF THE DRAWINGS

These and/or other aspects, features, and advantages of the invention will become apparent and more readily appreciated from the following description of exemplary embodiments, taken in conjunction with the accompanying drawings of which.

DETAILED DESCRIPTION

Figure 1:
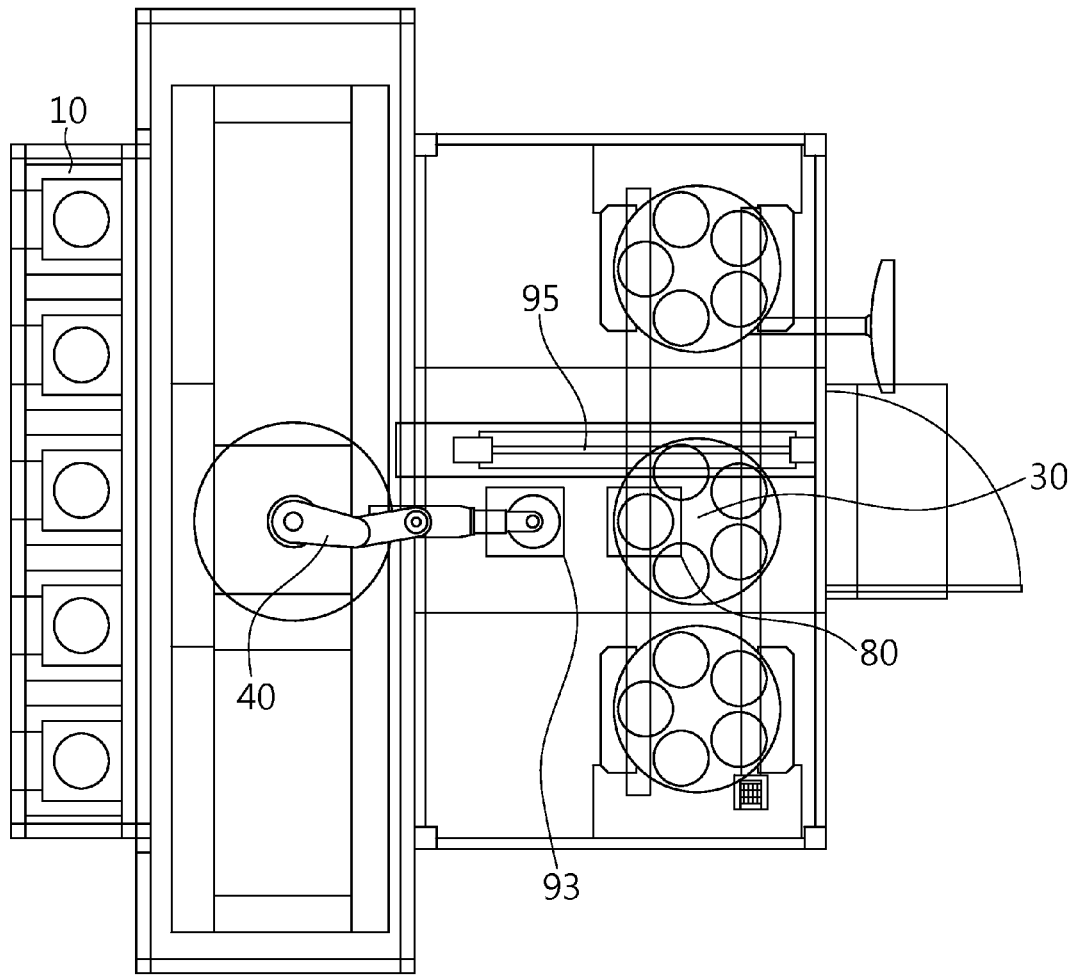
FIG. 1 is a plane diagram of a light-emitting diode (LED) wafer supplying apparatus according to an embodiment of the present invention.
Figure 2:
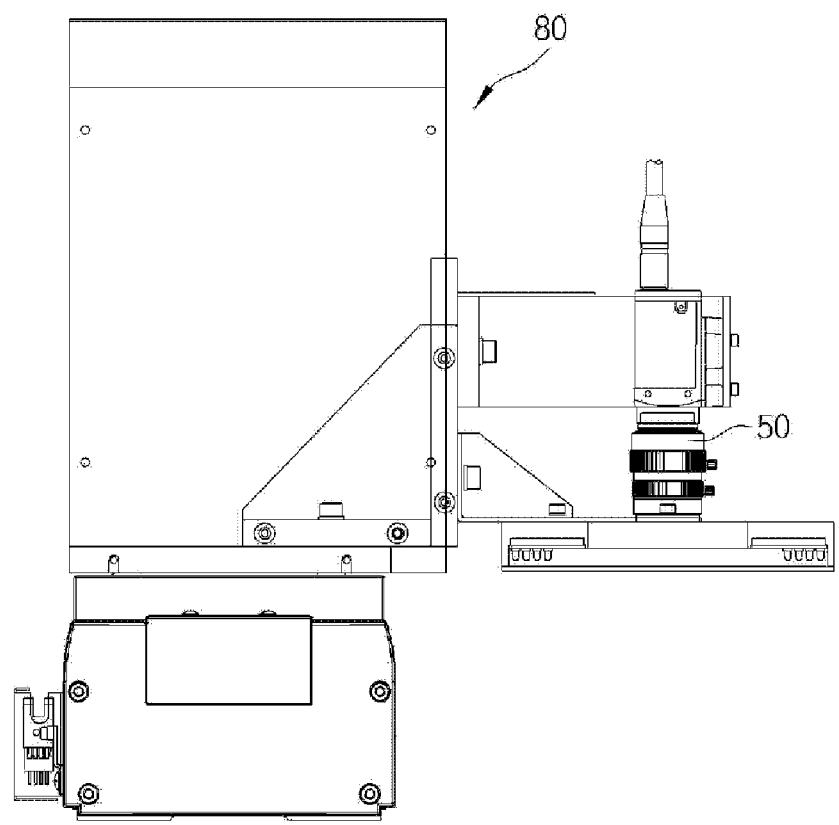
FIG. 2 is a side diagram of a low magnification camera included in the LED wafer supplying apparatus of FIG. 1.
Figure 3:
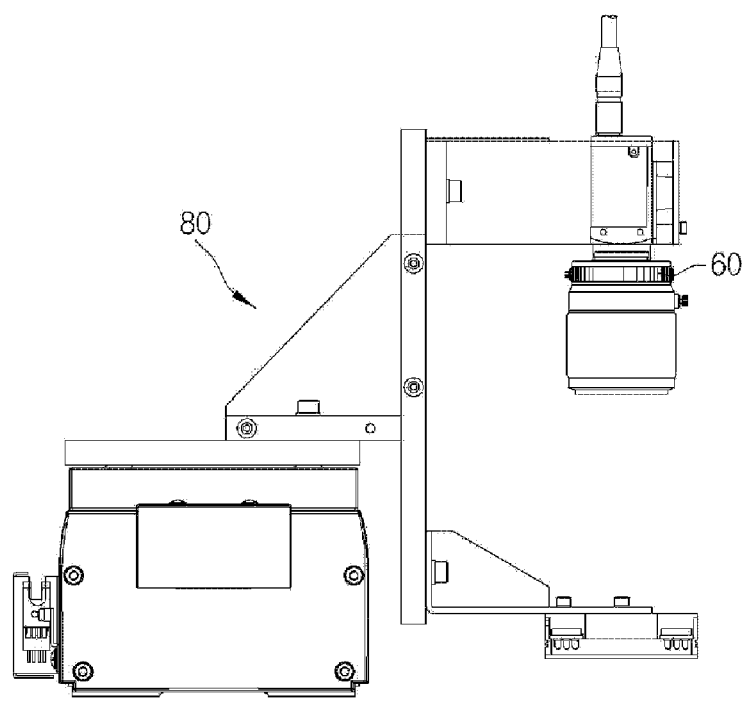
FIG. 3 is a side diagram of a high magnification camera included in the LED wafer supplying apparatus of FIG. 1.

Reference will now be made in detail to exemplary embodiments of the present invention, examples of which are illustrated in the accompanying drawings, wherein like reference numerals refer to the like elements throughout. Exemplary embodiments are described below to explain the present invention by referring to the figures.

Hereinafter, a technical configuration of a light-emitting diode (LED) wafer supplying apparatus will be described in detail based on the accompanying drawings.

As shown in FIGS. 1 through 6, an LED wafer supplying apparatus according to an embodiment of the present invention may include a cassette 10, a carrier 30, an aligning unit 93, a transfer robot 40, a picker 20 (FIG. 4), a capturing unit 80, and an LED wafer loading robot 95.

Figure 5:
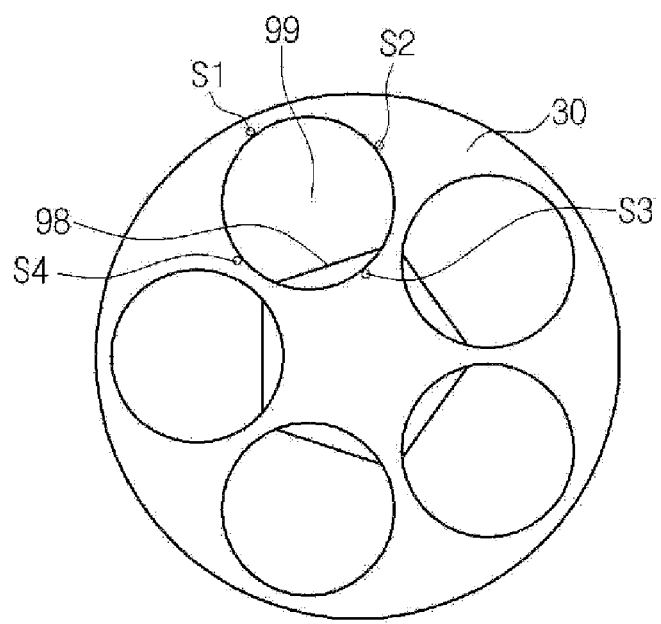
FIG. 5 is a plane diagram of a carrier included in the LED wafer supplying apparatus of FIG. 1.
Figure 6:
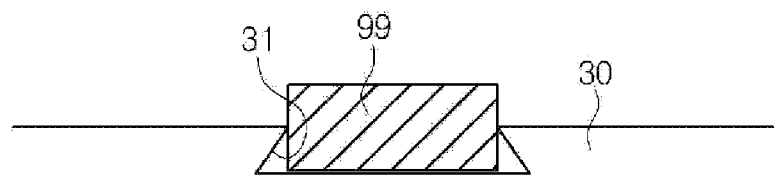
FIG. 6 is a side cross-sectional diagram of the carrier.

A plurality of cassettes 10 may be installed, and a plurality of LED wafers 99 may be loaded in the cassettes 10, as shown in FIGS. 5 and 6.

The carrier 30 may include a plurality of pockets 31 (FIG. 6) in which the LED wafers 99 are seated. The carrier 30 may be provided in the form of a circular plate. The pockets 31 may be arranged radially with respect to a center of the carrier 30 along a circumference of the carrier 30, and may be spaced apart at predetermined intervals.

The aligning unit 93 may align the LED wafers 99 that are to be seated in the carrier 30, as shown in FIG. 5. In this instance, to align the LED wafers 99, flat surfaces 98 of the LED wafers 99 may be verified using an optical sensor and the like, and an OCR CAM test may be performed.

The transfer robot 40 may transfer the LED wafers 99 from the cassette 10 to the aligning unit 93.

The picker 20 may hold, in an adsorbed state, the LED wafer 99 transferred to the aligning unit 93, or may release the adsorbed state. Specifically, when highly compressed air is drawn in from a top of the picker 20 and is discharged along a streamlined discharge surface, vacuum may be created in a central portion of the discharge surface, based on the Bernoulli's principle, and accordingly the LED wafers 99 may be held in the adsorbed state by the vacuum, without coming into contact with the picker 20. The discharge surface may be formed in a side in which the compressed air is discharged downward.

In this instance, the compressed air flowing along the discharge surface may be enabled to be discharged again upward. This is because, when the compressed air flows down toward the LED wafers 99, foreign substances around the LED wafers 99 may be scattered by the compressed air, and may be attached to the LED wafers 99, which may cause defects.

However, the picker 20 may hold the LED wafers 99 in the adsorbed state, using other schemes.

The capturing unit 80 may acquire position information of the pockets 31. The position information acquired by the capturing unit 80 may be transmitted to a control unit (not shown), and the control unit may enable the LED wafers 99 to be seated in appropriate pockets 31. Additionally, the capturing unit 80 may fix the picker 20 in a bottom center of the capturing unit 80, as shown in FIG. 4.

The LED wafer loading robot 95 (FIG. 1) may repetitively move in an X-axis direction, so that the picker 20 and the capturing unit 80 may be transferred from the aligning unit 93 to the carrier 30.

Figure 4:
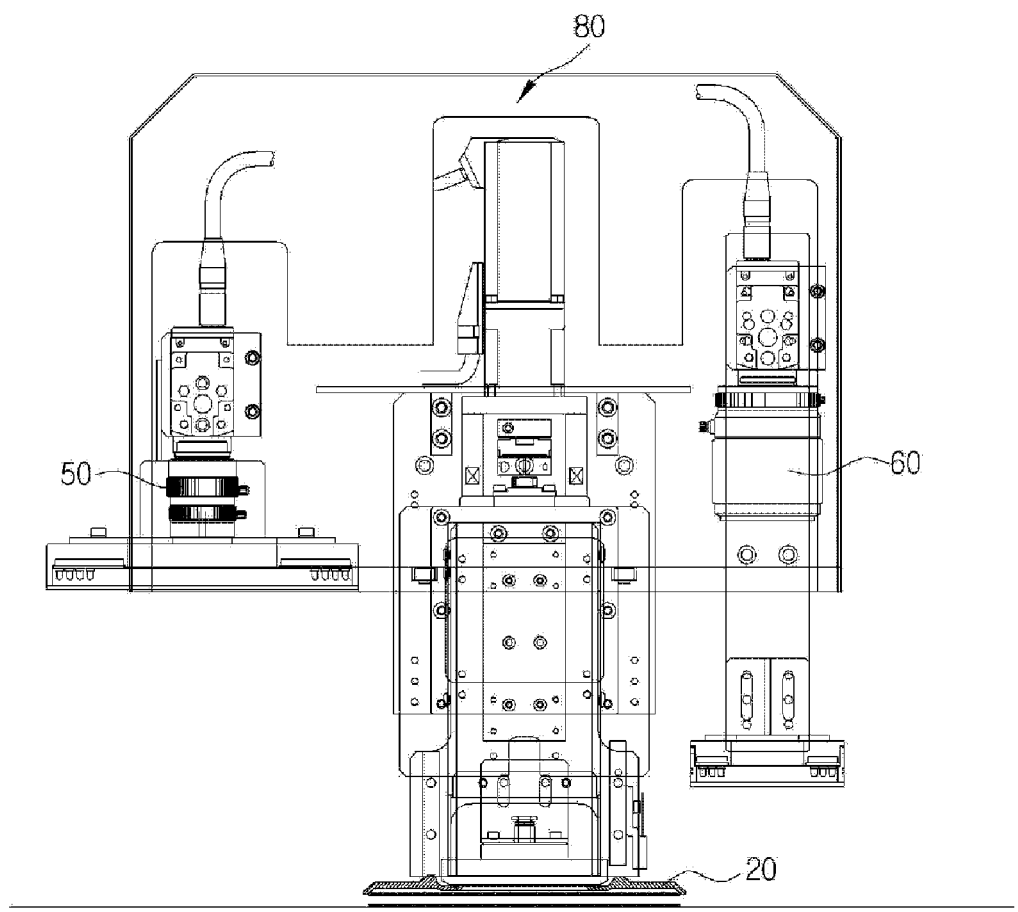
FIG. 4 is a front diagram of a capturing unit included in the LED wafer supplying apparatus of FIG. 1.

In this instance, the capturing unit 80 may include a low magnification camera 50, and a high magnification camera 60, as shown in FIG. 4.

The low magnification camera 50 may capture a position of the pocket 31 at a low magnification. In this instance, the low magnification camera 50 may capture the entire pocket 31 at a single spot. The low magnification camera 50 may acquire an overall shape of the pocket 31 at a predetermined distance from a top of the pocket 31 and accordingly, may locate the pocket 31 at a relatively high speed.

The high magnification camera 60 may capture the position of the pocket 31 at a high magnification. In this instance, the high magnification camera 60 may capture a part of the pocket 31 at a plurality of spots S1, S2, S3, and S4, as shown in FIG. 5. The high magnification camera 60 may acquire edges of the pocket 31 from the spots S1, S2, S3, and S4, at a predetermined distance from the top of the pocket 31, and may accurately locate the pocket 31 based on the acquired edges.

In other words, since the low magnification camera 50 and the high magnification camera 60 are included in the capturing unit 80, it is possible to quickly and accurately locate the pockets 31 in the carrier 30.

Figure 7:
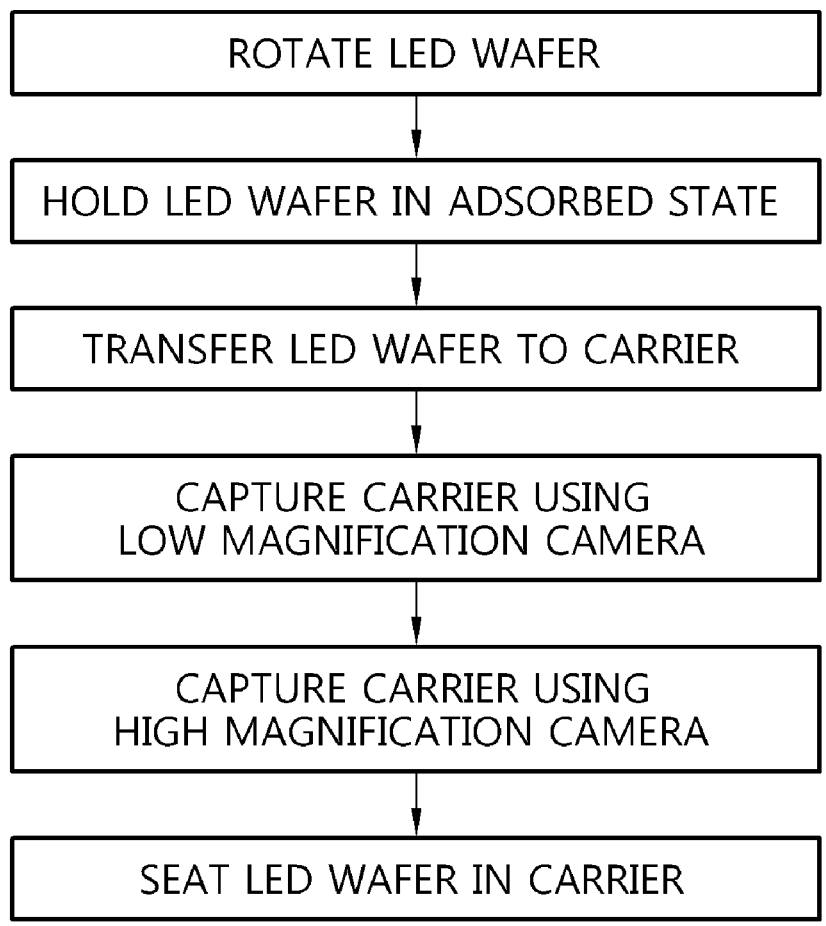
FIG. 7 is a flowchart illustrating a method of supplying an LED wafer according to an embodiment of the present invention.

FIG. 7 is a flowchart illustrating a method of supplying an LED wafer according to an embodiment of the present invention.

The method of FIG. 7 may include rotating the LED wafers 99 so that the flat surfaces 98 of the LED wafer 99 face a single direction, holding, by the picker 20, the LED wafers 99 in the adsorbed state, transferring the LED wafers 99 to the carrier 30 using the LED wafer loading robot 95, capturing the positions of the pockets 31 in the carrier 30 using the low magnification camera 50, capturing the positions of the pockets 31 in the carrier 30 using the high magnification camera 60, and seating the LED wafers 99 in the pockets 31.

In this instance, the low magnification camera 50 may capture the entire pocket 31 at a single spot, and the high magnification camera 60 may capture edges of the pocket 31 at the spots S1, S2, S3, and S4.

Specifically, the LED wafers 99 may be supplied to the cassette 10. Subsequently, the transfer robot 40 may transfer the LED wafers 99 loaded in the cassette 10 to the aligning unit 93. The supplied LED wafers 99 may be rotated and aligned in the aligning unit 93, so that the flat surfaces 98 of the LED wafers 99 may face a single direction. In other words, the flat surfaces 98 may face the center of the carrier 30, to seat the LED wafers 99 in the carrier 30. Subsequently, the OCR CAM test and the like may be performed to the aligned LED wafers 99.

The picker 20 may hold, in the adsorbed state, the LED wafers 99 aligned in the aligning unit 93. Additionally, the capturing unit 80 fixing the picker 20 may be transferred to the carrier 30 by the LED wafer loading robot 95, and accordingly the LED wafers 99 may also be transferred to the carrier 30.

The low magnification camera 50 may quickly recognize the positions of the pockets 31 in the carrier 30, and the high magnification camera 60 may acquire exact positions of the pockets 31. When the positions of the pockets 31 are recognized, the LED wafers 99 may be transferred to the exact positions of the pockets 31 based on information regarding the positions, the adsorbed state of the LED wafers 99 may be released by the picker 20, and the LED wafers 99 may be seated in the carrier 30. In other words, a loading process may be completed.

For example, when a loading process for a single LED wafer 99 is completed, the carrier 30 may be enabled to rotate a predetermined angle so that the LED wafer 99 may be seated in a next empty pocket 31. The LED wafer loading robot 95 may move again to the aligning unit 93, and may load all of the LED wafers 99 in the pockets 31 by repeating the above-described transfer operation.

As shown in FIGS. 8 through 12, an LED wafer supplying apparatus according to another embodiment of the present invention may include a supplying unit 360, a seating unit 370, a recovering unit 380, a Y-axis carrier transfer robot 390, an aligning unit 393, a transfer robot 340, and an LED wafer loading robot 395.

The supplying unit 360 may supply a carrier 330, and the seating unit 370 may seat a plurality of LED wafers 399 in the carrier 330. Additionally, the recovering unit 380 may recover the carrier 330 in which the LED wafers 399 (FIG. 11) are seated.

The supplying unit 360, the seating unit 370, and the recovering unit 380 may be sequentially arranged in a line, and may be disposed in space within a single frame. However, the supplying unit 360, the seating unit 370, and the recovering unit 380 may be partitioned to each other, that is, may have their own independent space. Additionally, the supplying unit 360, the seating unit 370, and the recovering unit 380 may be individually manufactured, and may be connected to each other.

The Y-axis carrier transfer robot 390 may repetitively move in a Y-axis direction so that the carrier 330 may be transferred from the supplying unit 360 to the seating unit 370 (FIG. 9) and the recovering unit 380. Specifically, the Y-axis carrier transfer robot 390 may include a conveyor, a stage, a motor, and the like, although not shown in the drawings. The conveyor may extend from the supplying unit 360 to the recovering unit 380 through the seating unit 370. The stage may be connected to the conveyor, and may be moved in a straight line, and the motor may be used to operate the stage.

Additionally, the conveyor may function to guide the stage so that the stage may move in a straight line. The stage may be used to fix the carrier 330.

The aligning unit 393 may align the LED wafers 399 that are to be seated in the carrier 330. In this instance, to align the LED wafers 399, flat surfaces 398 (FIG. 11) of the LED wafers 399 may be verified using an optical sensor and the like, and an OCR CAM test may be performed.

The transfer robot 340 may transfer the LED wafers 399 from the cassette 310 to the aligning unit 393.

The LED wafer loading robot 395 may be disposed orthogonally to the Y-axis carrier transfer robot 390 within the seating unit 370. The LED wafer loading robot 395 may repetitively move in an X-axis direction, so that the LED wafers 399 transferred to the aligning unit 393 may be picked up and transferred to the carrier 330.

In this instance, the picker 320 may be used to pick up the LED wafers 399 transferred to the aligning unit 393. Specifically, the picker 320 may hold, in an adsorbed state, the LED wafer 399 transferred to the aligning unit 393, or may release the adsorbed state. When highly compressed air is drawn in from a top of the picker 320 and is discharged along a streamlined discharge surface, vacuum may be created in a central portion of the discharge surface, based on the Bernoulli's principle, and accordingly the LED wafers 399 may be held in the adsorbed state by the vacuum, without coming into contact with the picker 320. The discharge surface may be formed in a side in which the compressed air is discharged downward.

In this instance, the compressed air flowing along the discharge surface may be enabled to be discharged again upward. This is because, when the compressed air flows down toward the LED wafers 399, foreign substances around the LED wafers 399 may be scattered by the compressed air, and may be attached to the LED wafers 399, which may cause defects.

However, the picker 320 may hold the LED wafers 399 in the adsorbed state, using other schemes.

Additionally, the LED wafer supplying apparatus may further include a carrier aligning unit (not shown).

The carrier aligning unit may lift the carrier 330 using vacuum, and may enable the carrier 330 to rotate 360°, so that the LED wafers 399 are seated in the carrier 330.

The LED wafer supplying apparatus configured as described above may automatically perform a series of processes from supplying of LED wafers 399 to loading of the LED wafers 399 in the carrier 330, and a series of processes that are associated with supplying and recovering of the carrier 330.

Additionally, since the LED wafer supplying apparatus has a compact installation structure within a single frame, the LED wafer supplying apparatus may be less restricted in use of space, and a reduction in manufacturing costs may be expected.

Figure 8:
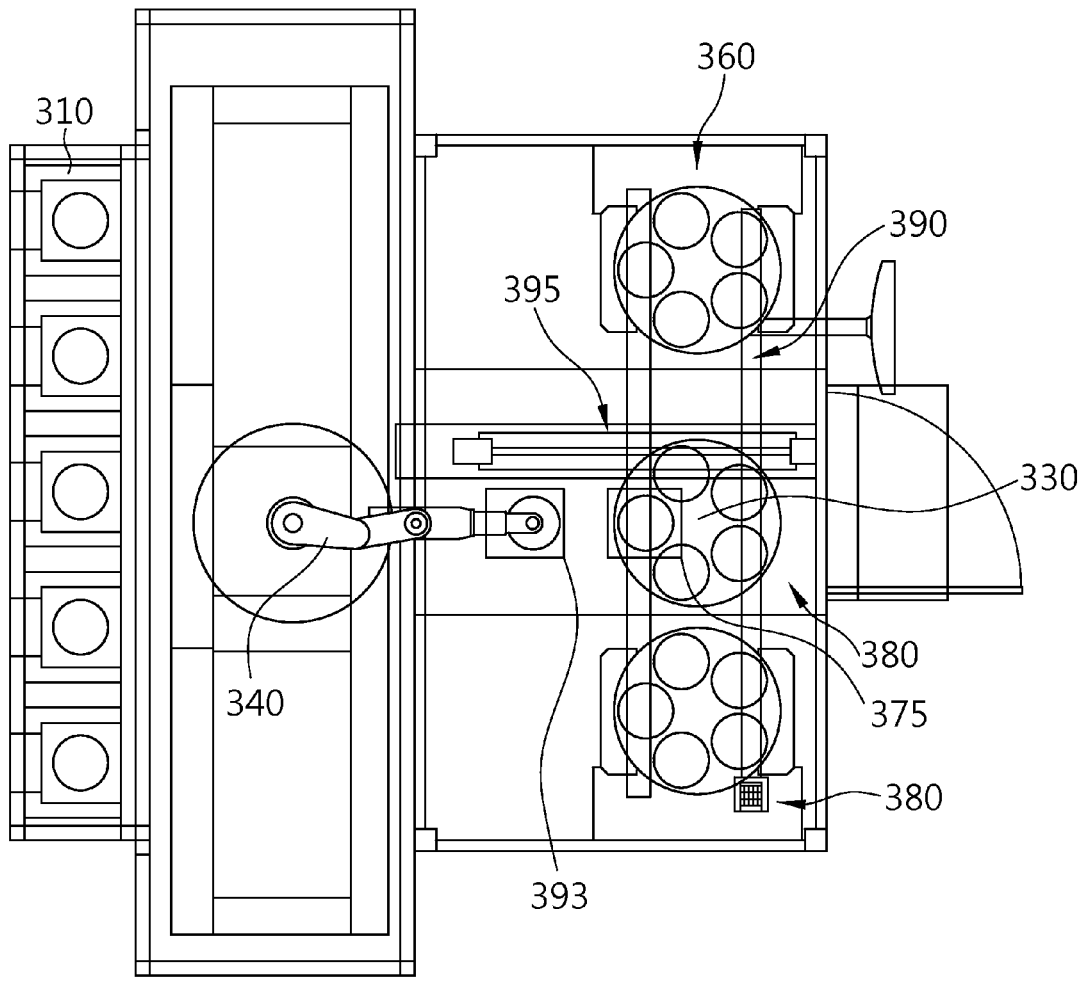
FIG. 8 is a plane diagram of an LED wafer supplying apparatus according to another embodiment of the present invention.
Figure 9:
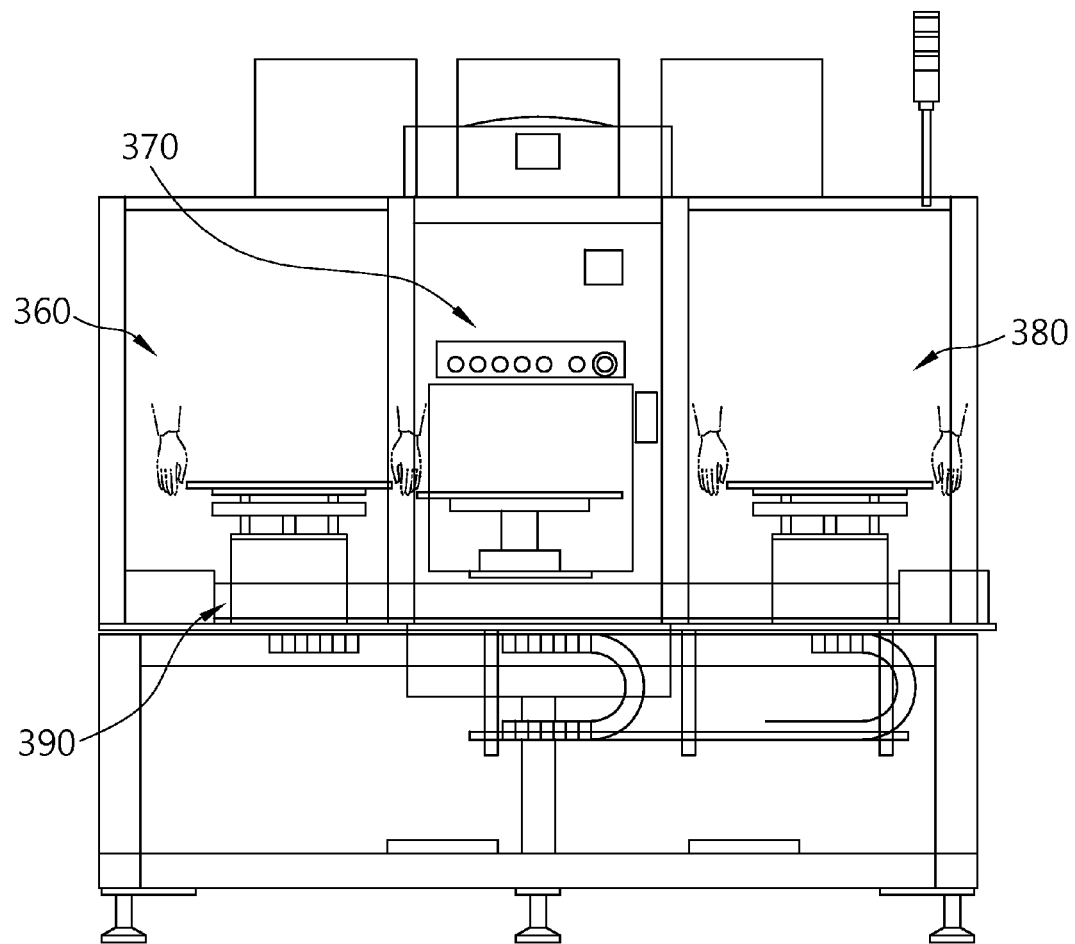
FIG. 9 is a front diagram of the LED wafer supplying apparatus of FIG. 8.
Figure 10:
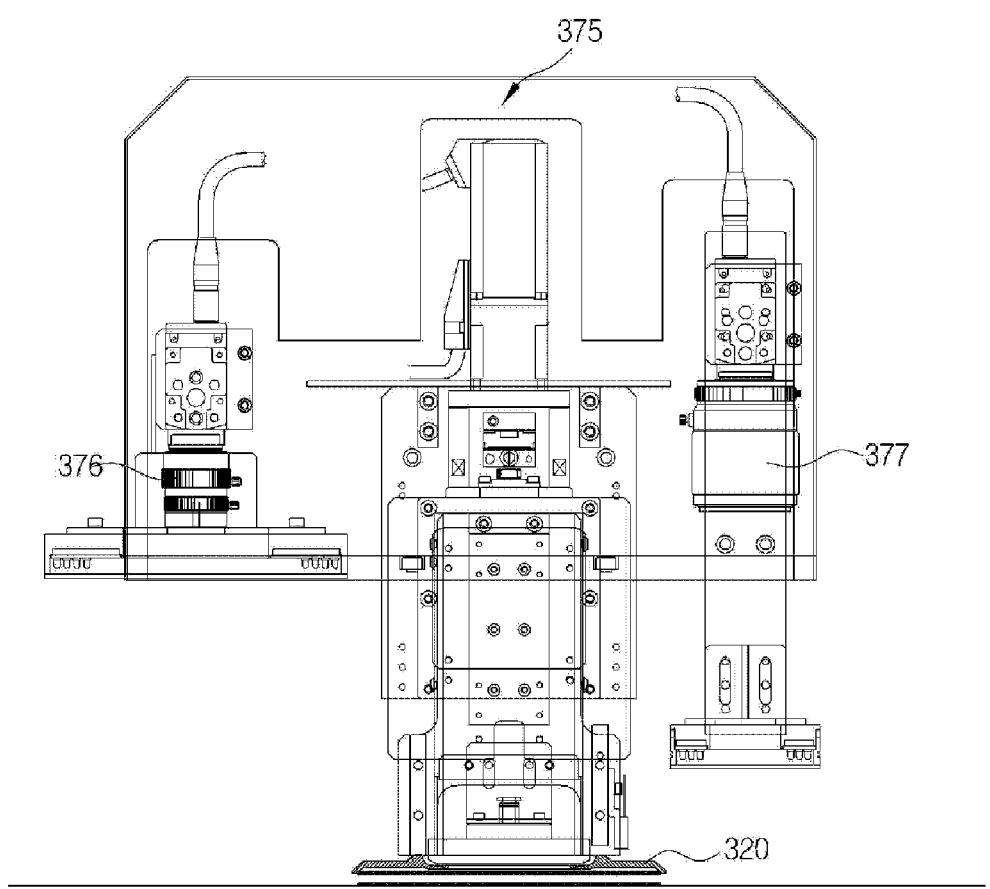
FIG. 10 is a front diagram of a capturing unit included in the LED wafer supplying apparatus of FIG. 8.
Figure 11:
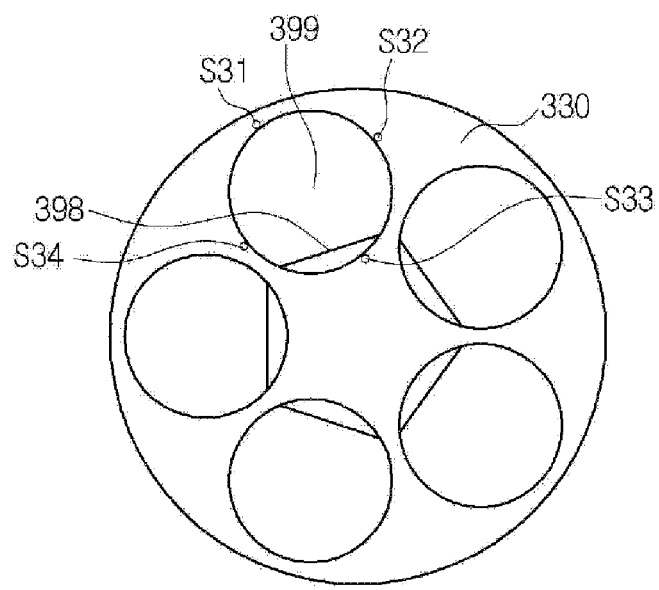
FIG. 11 is a plane diagram of a carrier included in the LED wafer supplying apparatus of FIG. 8.
Figure 12:
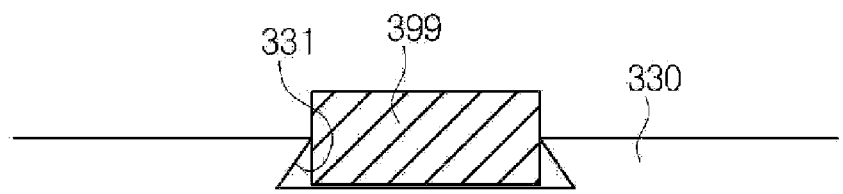
FIG. 12 is a side cross-sectional diagram of the carrier.

Referring to FIGS. 8 and 10, the LED wafer supplying apparatus may further include a capturing unit 375. The capturing unit 375 may include a low magnification camera 376, and a high magnification camera 377.

The low magnification camera 376 may capture a position of the pocket 331 (FIG. 12) at a low magnification. In this instance, the low magnification camera 376 may capture the entire pocket 331 at a single spot. The low magnification camera 376 may acquire an overall shape of the pocket 331 at a predetermined distance from a top of the pocket 331 and accordingly, may locate the pocket 331 at a relatively high speed. The pockets 331 may be formed in the carrier 330.

The high magnification camera 377 may capture the position of the pocket 331 at a high magnification. In this instance, the high magnification camera 377 may capture a part of the pocket 331 at a plurality of spots S31, S32, S33, and S34, shown in FIG. 11. The high magnification camera 377 may acquire edges of the pocket 331 from the spots S31, S32, S33, and S34, at a predetermined distance from the top of the pocket 331, and may accurately locate the pocket 331 based on the acquired edges.

Figure 13:
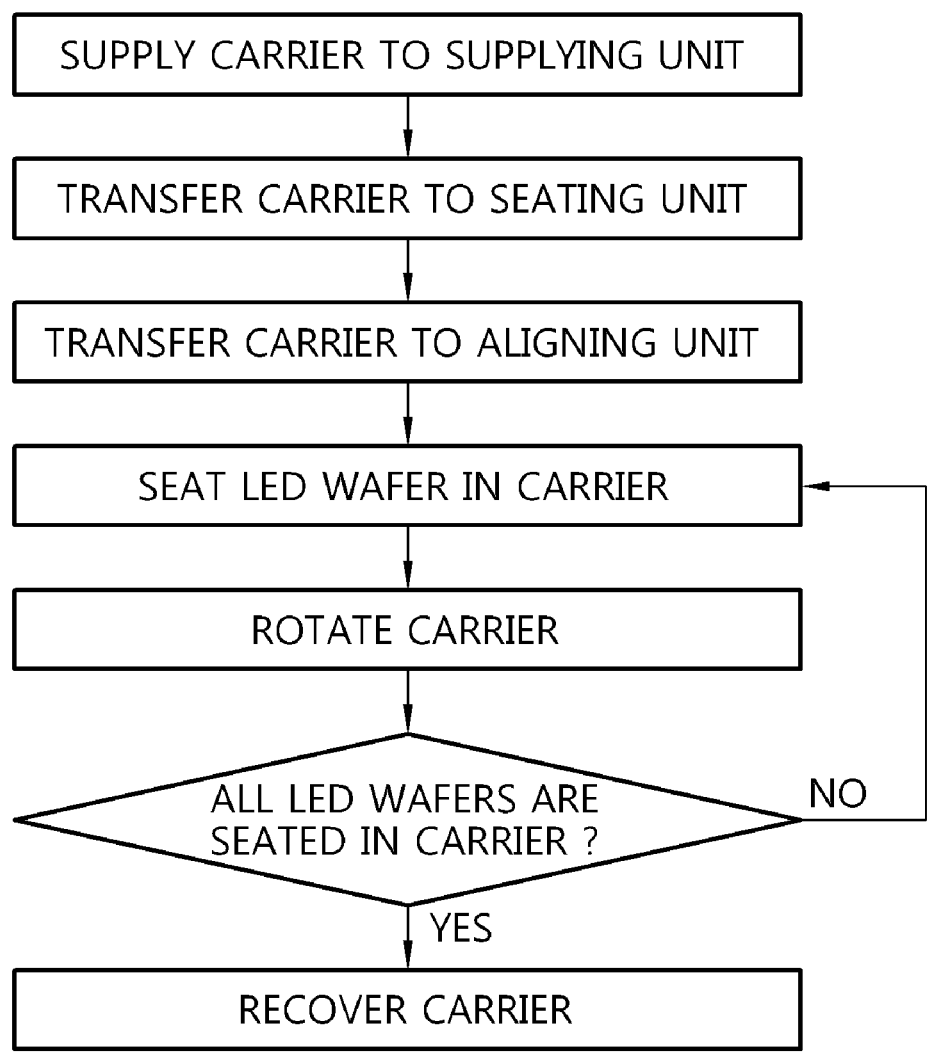
FIGS. 13 and 14 are flowcharts illustrating a method of supplying an LED wafer according to another embodiment of the present invention.
Figure 14:
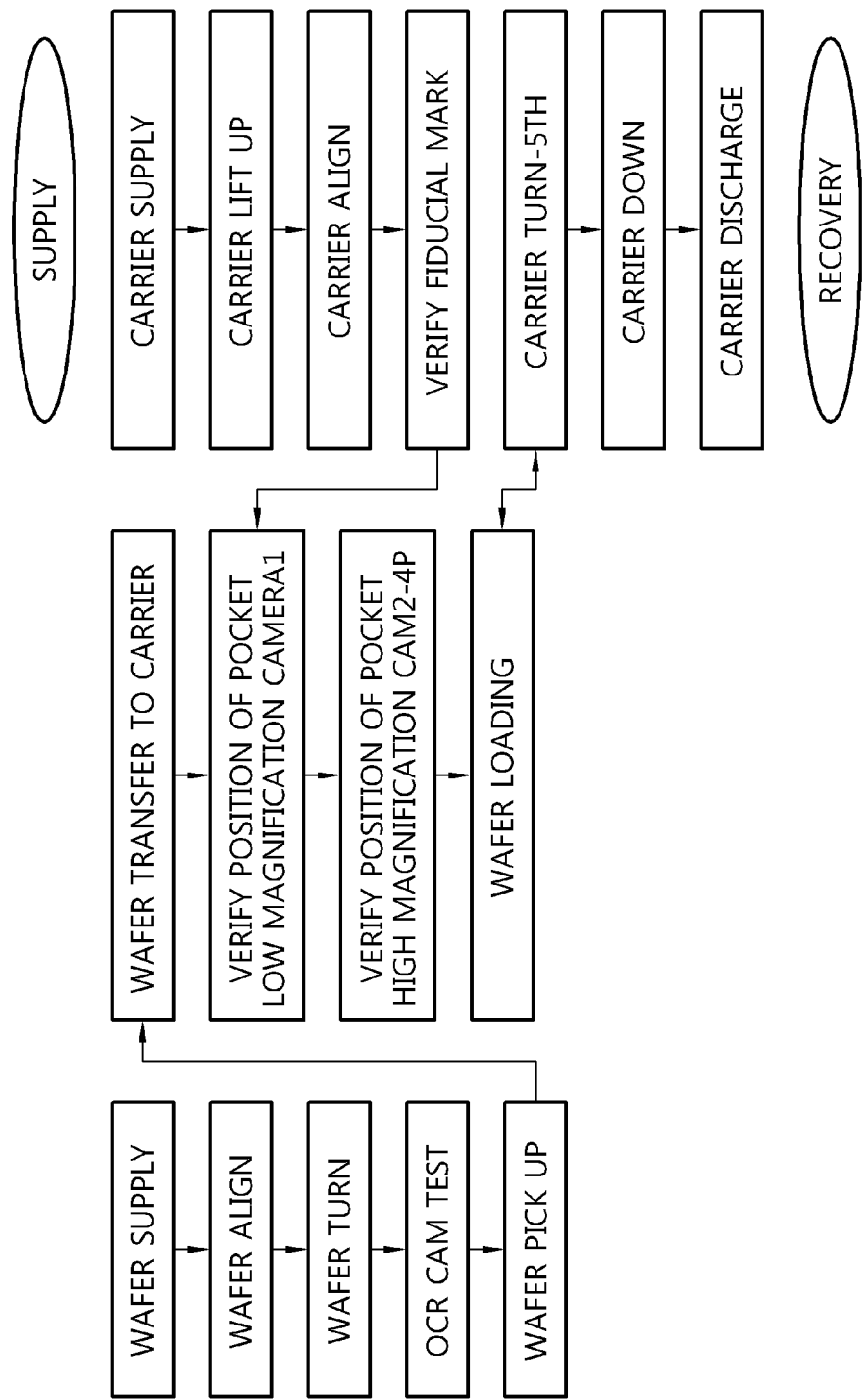

Referring to FIGS. 13 and 14, a method of supplying an LED wafer using the apparatus shown in FIGS. 8-12 according to another embodiment of the present invention may include supplying the carrier 330 to the supplying unit 360, transferring the carrier 330 to the seating unit 370, transferring, by the transfer robot 340, the LED wafers 399 loaded in the cassette 310 to the aligning unit 393, seating, in the carrier 330, the LED wafers 399 transferred to the aligning unit 393, rotating the carrier 330, transferring the carrier 330 to the recovering unit 380 when all of the LED wafers 399 are seated in the carrier 330, and recovering the carrier 330 in which the LED wafers 399 are seated.

Specifically, the LED wafers 399 may be supplied to the cassette 310. Subsequently, the transfer robot 340 may transfer the LED wafers 399 loaded in the cassette 310 to the aligning unit 393. The supplied LED wafers 399 may be rotated and aligned in the aligning unit 393, so that the flat surfaces 398 of the LED wafers 399 may face a single direction. In other words, the flat surfaces 398 may face the center of the carrier 330, to seat the LED wafers 399 in the carrier 330. Subsequently, the OCR CAM test and the like may be performed to the aligned LED wafers 399.

The picker 320 may hold, in the adsorbed state, the LED wafers 399 aligned in the aligning unit 393. Additionally, the capturing unit 375 fixing the picker 320 may be transferred to the carrier 330 by the LED wafer loading robot 395, and accordingly the LED wafers 399 may also be transferred to the carrier 330.

The low magnification camera 376 may quickly recognize the positions of the pockets 331 in the carrier 330, and the high magnification camera 377 may acquire exact positions of the pockets 331. When the positions of the pockets 331 are recognized, the LED wafers 399 may be transferred to the exact positions of the pockets 331 based on information regarding the positions, the adsorbed state of the LED wafers 399 may be released by the picker 320, and the LED wafers 399 may be seated in the carrier 330.

For example, when a loading process for a single LED wafer 399 is completed, the carrier 330 may be enabled to rotate a predetermined angle so that the LED wafer 399 may be seated in a next empty pocket 331. The LED wafer loading robot 395 may move again to the aligning unit 393, and may load all of the LED wafers 399 in the pockets 331 by repeating the above-described transfer operation.

Additionally, an operation of automatically or manually supplying the carrier 330 to the supplying unit 360 may be performed. The supplied carrier 330 may be lifted and transferred to the seating unit 370 by the Y-axis carrier transfer robot 390. In this instance, the carrier 330 may be aligned, and a fiducial mark may be verified.

When loading the LED wafers 399 is completed, the carrier 330 in which the LED wafers 399 are seated may be transferred to the recovering unit 380 by the Y-axis carrier transfer robot 390.

The carrier 330 transferred to the recovering unit 380 may be manually or automatically recovered. Accordingly, a series of process of supplying LED wafers may be completed.

Although the LED wafer supplying apparatus and method according to the embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

What is claimed is:

1. An apparatus for supplying a light-emitting diode (LED) wafer, the apparatus comprising:
   a cassette in which a plurality of LED wafers are loaded;
   a carrier including a plurality of pockets in which the LED wafers are seated;
   an aligning unit to align the LED wafers that are to be seated in the carrier;
   a transfer robot to transfer the LED wafers from the cassette to the aligning unit;
   a picker to hold, in an adsorbed state, the LED wafers transferred to the aligning unit, or to release the adsorbed state;
   a capturing unit to acquire position information of the pockets, the capturing unit configured to:
      determine a position of each of the plurality of pockets in the carrier using data from a low magnification camera, which is positioned at a first predetermined vertical distance above the picker; and
      determine a plurality of edge positions of each of the plurality of pockets using data from a high magnification camera, which is positioned at a second predetermined vertical distance above the picker, wherein the second predetermined distance is different than the first predetermined distance, and wherein the low magnification camera and the high magnification camera are each positioned a lateral distance away from, and are located on different sides of, the picker; and
   an LED wafer loading robot to transfer the picker and the capturing unit from the aligning unit to the carrier.

2. The apparatus of claim 1, wherein the capturing unit comprises:
   the low magnification camera to capture positions of the pockets at a low magnification; and
   the high magnification camera to capture the positions of the pockets at a high magnification based on the plurality of edge positions.

3. A method of supplying a light-emitting diode (LED) wafer, the method comprising:
   rotating a plurality of LED wafers so that flat surfaces of the LED wafers face a single direction;
   holding, by a picker, the LED wafers in an adsorbed state;
   transferring the LED wafers to a carrier using an LED wafer loading robot;
   determine a position of each of the plurality of pockets in the carrier using data from a low magnification camera, which is positioned at a first predetermined vertical distance above the picker; and
   determine a plurality of edge positions of each of the plurality of pockets using data from a high magnification camera, which is positioned at a second predetermined vertical distance above the picker, wherein the second predetermined distance is different than the first predetermined distance, and wherein the low magnification camera and the high magnification camera are each positioned a lateral distance away from, and are located on different sides of, the picker; and
   seating the LED wafers in the pockets.

4. The method of claim 3, wherein the low magnification camera captures an entire pocket at a single spot, and the high magnification camera captures edges of the pocket at a plurality of spots.

5. An apparatus for supplying a light-emitting diode (LED) wafer, the apparatus comprising:
- a supplying unit to supply a carrier;
- a seating unit to seat a plurality of LED wafers in the carrier;
- a recovering unit to recover the carrier;
- a Y-axis carrier transfer robot to repetitively move in a Y-axis direction so that the carrier is transferred from the supplying unit to the seating unit and the recovering unit;
- an aligning unit to align the LED wafers;
- a transfer robot to transfer the LED wafers loaded in a cassette to the aligning unit;
- a capturing unit configured to:
  - determine a position of each of the plurality of pockets in the carrier using data from a low magnification camera, which is positioned at a first predetermined vertical distance above the picker; and
  - determine a plurality of edge positions of each of the plurality of pockets using data from a high magnification camera, which is positioned at a second predetermined vertical distance above the picker, wherein the second predetermined distance is different than the first predetermined distance, and wherein the low magnification camera and the high magnification camera are each positioned a lateral distance away from, and are located on different sides of, the picker; and
- an LED wafer loading robot to repetitively move in an X-axis direction so that the LED wafers transferred to the aligning unit are lifted and transferred to the carrier, the LED wafer loading robot being disposed orthogonally to the Y-axis carrier transfer robot within the seating unit.

6. The apparatus of claim 5, further comprising:
a carrier aligning unit to lift the carrier using vacuum and to enable the carrier to rotate 360°, so that the LED wafers are seated in the carrier.

* * * * *